United States Patent
Lu et al.

(10) Patent No.: US 8,643,141 B2
(45) Date of Patent: Feb. 4, 2014

(54) CAPACITOR ARRAY LAYOUT ARRANGEMENT FOR HIGH MATCHING METHODOLOGY

(75) Inventors: Chung-Ting Lu, Kaohsiung (TW); Chih-Chiang Chang, Taipei (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 13/602,471

(22) Filed: Sep. 4, 2012

(65) Prior Publication Data

US 2013/0270671 A1  Oct. 17, 2013

Related U.S. Application Data

(60) Provisional application No. 61/624,510, filed on Apr. 16, 2012.

(51) Int. Cl.
*H01L 21/02* (2006.01)
*H01L 21/20* (2006.01)

(52) U.S. Cl.
USPC ............ 257/532; 257/E21.016; 257/E27.025; 257/E27.048; 257/E21.008; 438/381

(58) Field of Classification Search
CPC .. H01L 23/5223; H01L 27/0805; H01L 28/40
USPC ........... 257/532, E27.016, E27.025, E27.048, 257/E21.008; 438/381, 15, 18
See application file for complete search history.

(56) References Cited

U.S. PATENT DOCUMENTS

| | | | |
|---|---|---|---|
| 5,952,952 A * | 9/1999 | Choi et al. | 341/172 |
| 6,124,821 A * | 9/2000 | Pezzini et al. | 341/161 |
| 6,614,645 B1 * | 9/2003 | Sakurai et al. | 361/328 |
| 7,554,789 B2 * | 6/2009 | Chen | 361/328 |
| 2002/0085334 A1 * | 7/2002 | Figueroa et al. | 361/301.4 |
| 2005/0189614 A1 * | 9/2005 | Ihme et al. | 257/532 |
| 2010/0181645 A1 * | 7/2010 | Marenco | 257/532 |

* cited by examiner

*Primary Examiner* — Nikolay Yushin
(74) *Attorney, Agent, or Firm* — Eschweiler & Associates, LLC (57) ABSTRACT

Some embodiments relate a capacitor array arranged on a semiconductor substrate. The capacitor array includes an array of unit capacitors arranged in a series of rows and columns. An interconnect structure couples unit capacitors of the array to establish a plurality of capacitor elements. The respective capacitor elements have different numbers of unit capacitors and different corresponding capacitances. In establishing the plurality of capacitor elements, the interconnect structure couples unit capacitors of the array in substantially identical sub-arrays tiled over the semiconductor substrate. Other methods and devices are also disclosed.

19 Claims, 6 Drawing Sheets

CAPACITOR ARRAY LAYOUT ARRANGEMENT FOR HIGH MATCHING METHODOLOGY

REFERENCE TO RELATED APPLICATIONS

This application is a Non-Provisional application claiming priority to U.S. Provisional Application Ser. No. 61/624,510 filed Apr. 16, 2012 entitled "Capacitor Array Layout Arrangement for High Matching Methodology" and is incorporated herein.

BACKGROUND

Capacitor arrays are used in many integrated circuit applications. Capacitor arrays are typically made up of a number or unit capacitors, which are each designed to have the same capacitance. Because the equality of the unit capacitances is an underlying premise for accurate circuit operation in many applications, it is desirable to improve the matching of these unit capacitors.

DETAILED DESCRIPTION

The present invention will now be described with reference to the attached drawing figures, wherein like reference numerals are used to refer to like elements throughout, and wherein the illustrated structures and devices are not necessarily drawn to scale.

Figure 6A:
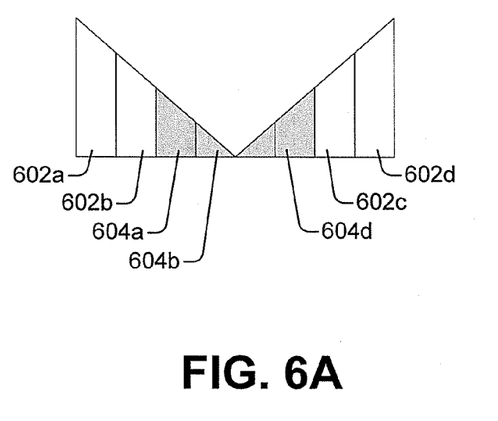
FIGS. 6A-6B illustrate embodiments of capacitor arrays that are affected by dishing.
Figure 7A:
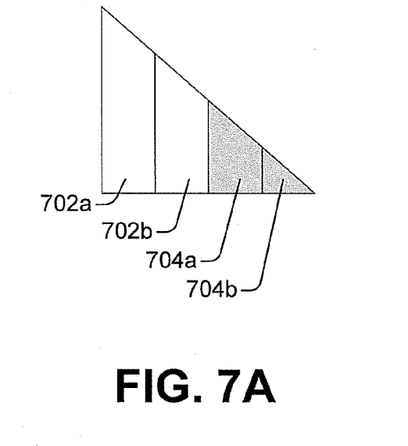
FIGS. 7A-7B illustrate embodiments of capacitors arrays that are affected by sloping.

To improve matching of unit capacitors in capacitor arrays, special attention is paid to the layout of the unit capacitors that make up the array. In particular, conventional capacitor array layouts are susceptible to dishing or sloping, which can lead to severe unit capacitor mismatch. In dishing, for example, chemical mechanical polishing or other process steps may form a circular, concave recess (e.g., much like a dish or bowl) in some regions on the substrate. FIG. 6A shows an example of a workpiece having a capacitor array affected by dishing. The capacitor array includes eight unit capacitor features, which are grouped into two capacitor elements. A first capacitor element includes four capacitors on an upper region of the dish (e.g., capacitors $602a$-$602d$), while a second (undesirably unmatched) capacitor includes four capacitors on a lower region of the dish (e.g., capacitors $604a$-$604d$). The dishing can cause the second capacitor element to have a lower capacitance than the first capacitor element, for example. Sloping, in contrast, can be a continuous (e.g., linear) slope over the surface of the substrate that also affects matching. FIG. 7A shows an example of a workpiece having a capacitor array with four unit capacitor features that are impacted by sloping. With sloping, a capacitor formed by unit capacitors on a higher portion of the slope (e.g., capacitors $702a$-$702b$) can behave differently relative to a capacitor formed by unit capacitors on a lower portion of the slope (e.g., capacitors $704a$-$704b$).

Figure 6B:
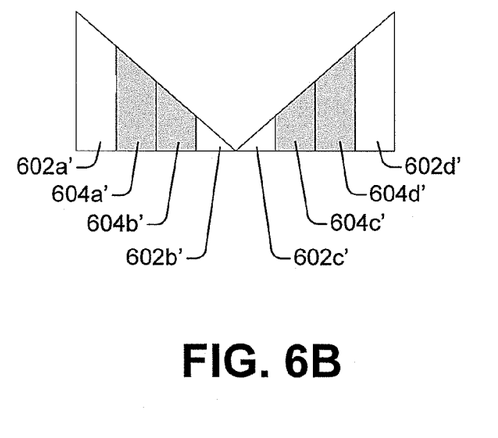
Figure 7B:
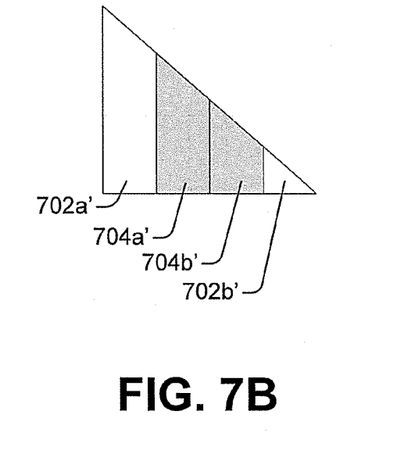

To limit the effects of dishing and/or sloping, improved layout techniques for capacitor arrays are provided herein. These layouts generally attempt to group capacitor elements so the unit capacitor elements are split equally or symmetrically between a center region of an array and an edge region of the array. For example, FIG. 6B shows an example where dishing-affected unit capacitors are grouped into two groups such that at total capacitance of the first capacitor element, which includes unit capacitors $602a'$-$602d'$, is substantially equal to that of the second capacitor element, which includes unit capacitors $604a'$-$604d'$. Similarly, FIG. 7B shows an example where sloping-affected unit capacitors are grouped into two groups such that a total capacitance of the first capacitor element, which includes unit capacitors $702a'$-$702b'$, is substantially equal to that of the second capacitor element, which includes unit capacitors $704a'$-$704b'$. This concept is extended to capacitors arrays as set forth in more detail below.

Figure 1:
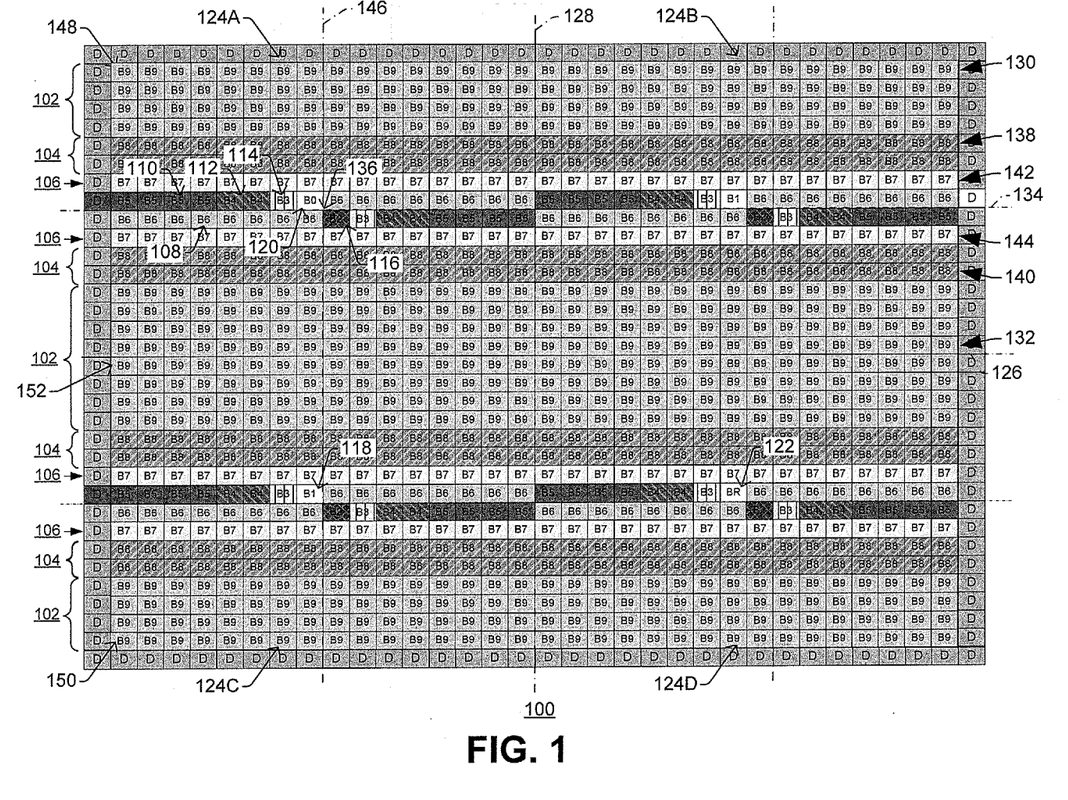
FIG. 1 illustrates an exemplary embodiment of a capacitor array.

FIG. 1 shows an exemplary embodiment of a capacitor array 100 arranged on a semiconductor substrate in accordance with some aspects of this disclosure. This capacitor array 100 includes an array of unit capacitors arranged in a series of rows and columns.

An interconnect structure couples unit capacitors together to establish a plurality of capacitor elements. The respective capacitor elements have different numbers of unit capacitors and, thus, different corresponding capacitances. In exemplary embodiments, capacitance values of the respective capacitor elements follow a geometric progression with a common ratio of approximately two. For example, in FIG. 1's exemplary embodiment, a first capacitor element 102 is made up of 512 unit capacitors (each labeled B9), a second capacitor element 104 is made up of 256 unit capacitors (each labeled B8), a third capacitor element 106 is made up of 128 unit capacitors (each labeled B7), a fourth capacitor element 108 is made up of 64 unit capacitors (each labeled B6), a fifth capacitor element 110 is made up of 32 unit capacitors (each labeled B5), a sixth capacitor element 112 is made up of 16 unit capacitors (each labeled B4), a seventh capacitor element 114 is made up of 8 unit capacitors (each labeled B3), an eighth capacitor element 116 is made up of 4 unit capacitors (each labeled B2), a ninth capacitor element 118 is made up of 2 unit capacitors (each labeled B1), and a tenth capacitor element 120 is made up of a single unit capacitor (labeled B0). One extra unit capacitor 122 (labeled BR) is also included. Dummy unit capacitors (D) can be disposed around a perimeter of the capacitor array 100.

In establishing the plurality of capacitor elements, the interconnect structure couples unit capacitors of the array in substantially identical sub-arrays (e.g., first, second, third and fourth sub-arrays—124A, 124B, 124C, and 124D, respectively), which are tiled over the semiconductor substrate. The substantially identical sub-arrays are typically equal in size and often have the same angular orientation when tiled over the semiconductor substrate. The sub-arrays are made up of respective unit capacitors in respective sub-array locations. For example, the first capacitor element unit capacitors (B9) are in the same sub-array locations in first sub-array 124A, second sub-array 124B, third sub-array 124C, and fourth sub-array 124D. The second capacitor element unit capacitors (B8) are in the same sub-array locations in first sub-array 124A, second sub-array 128B, third sub-array 124C, and fourth sub-array 124D; and so on. However, the sub-arrays are not necessarily perfectly identical but may have small differences over the array. For example, because tenth capacitor element has only a single unit capacitor (B0), it is present only in the first sub-array 124A and does not have an exactly corresponding unit capacitor in the other sub-arrays. Similarly, B1s, although in the same location in the second and third sub-arrays (124B, 124C), are not present in the first and fourth sub-arrays (124A, 124D).

Nonetheless, a substantial majority of the unit capacitors are in the same sub-array locations for the sub-arrays 124A-124D, such that the sub-arrays are substantially identical. Other slight changes over the sub-arrays can also be tolerated. For example, although FIG. 1's embodiment has more than 99% of unit capacitors in the same sub-array locations from sub-array to sub-array (i.e., 1020 of 1024 unit capacitors are in the same sub-array locations from one sub-array to the next), in some embodiments fewer of the unit capacitors, such as approximately 87% or approximately 95%, are in the same sub-array locations from one sub-array to another sub-array.

To build each sub-array, several entire rows of unit capacitors, which extend in parallel with a first axis 126, are coupled to the corresponding capacitor elements. This helps to resist dishing or sloping in the direction of the first axis 126. Columns of unit capacitors which extend in parallel with a second axis 128 are distributed equally at edge regions of the array and a center region of the array in a concentric manner. This helps alleviate capacitor mismatch induced by dishing or sloping in the direction of axis 128.

For example, with respect to a first sub-array 124A, first capacitor element 102 is made up of unit capacitors (B9) extending continuously across an entire first row 130 of the array and continuously across an entire second row 132 of the array (as well as other rows). The first and second rows 130, 132 extend in parallel with a first sub-array axis (134) extending through an origin 136 of the first sub-array 124A. The first and second rows 130, 132 are symmetrically spaced about opposite sides of the first sub-array axis 134. Second capacitor element is made up of unit capacitors (B8) which extend continuously across an entire third row 138 and continuously across an entire fourth row 140 of the array (as well as other rows). The third and fourth rows 138, 140 extend in parallel with the first sub-array axis 134 and are symmetrically spaced about opposite sides of the first sub-array axis 134. The third and fourth rows 138, 140 are closer to the first sub-array axis 134, relative to the first and second rows 130, 132 which are farther from the first sub-array axis 134. A third capacitor element is made up of unit capacitors (B7) and includes fourth and fifth rows 142, 144 extending continuously across the array. For smaller capacitor elements that do not span an entire row, such as B4 for example, the unit capacitors can be flipped about the first sub-array axis 134 to make them symmetric about the origin 136 of the first sub-array 124A.

Unit capacitors (B9) of the first capacitor element are arranged on opposing, symmetric distal column regions 148, 150; as well as in a central column region 152. Unit capacitors of the second capacitor element (B8) are concentrically arranged in regions 104, which are concentrically arranged between the distal regions 148, 150 and the central region 152, respectively.

Figure 2:
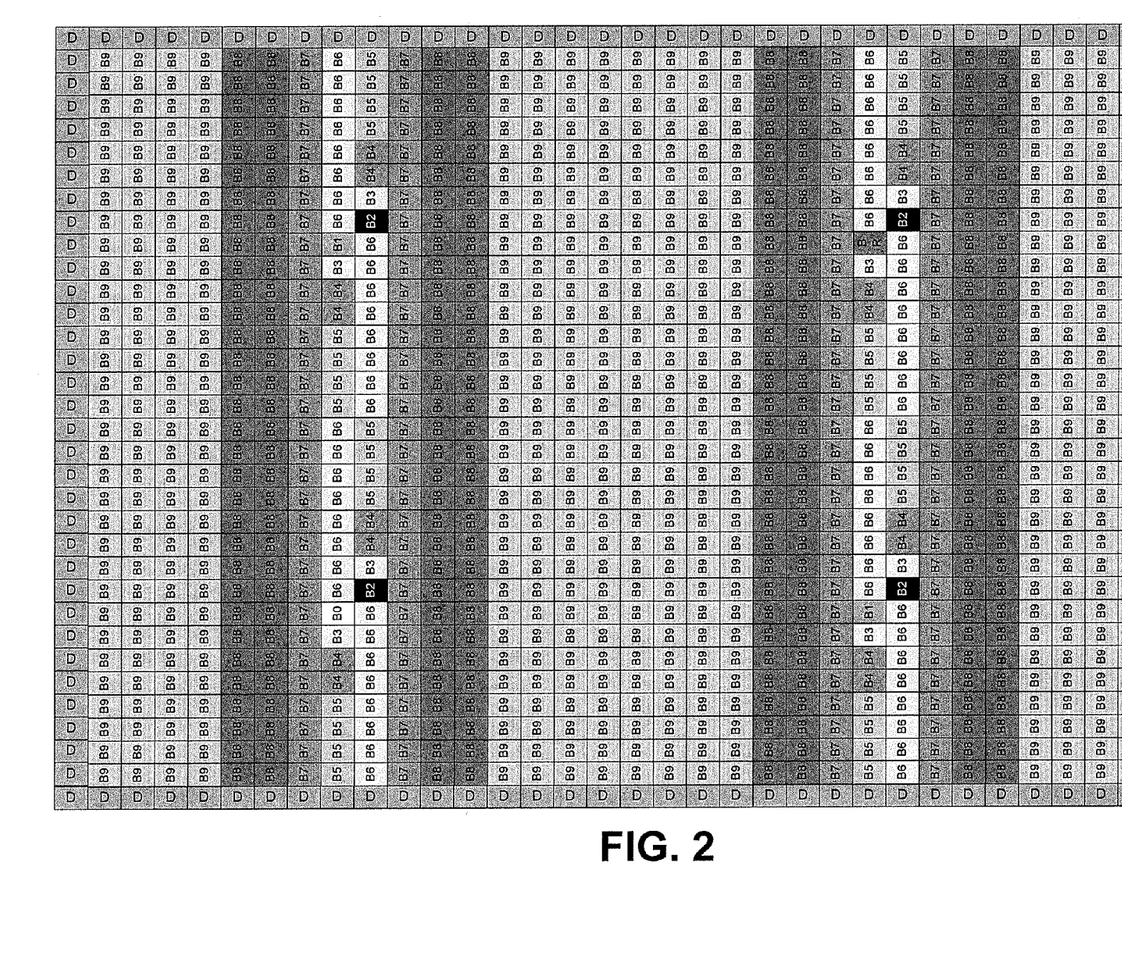
FIG. 2 illustrates an exemplary embodiment of a capacitor array wherein the rows and columns are transposed, relative to FIG. 1.

FIG. 2 shows another exemplary embodiment where the rows and columns of the array are transposed, relative to FIG. 1. Thus, it will be appreciated that the terms row and column, as used in this application, are interchangeable. Further, although the illustrated rows and columns are shown in FIG. 1 as extending along first and second axes 126, 128, respectively, which are perpendicular to one another, in other embodiments the first and second axes 126, 128 could be non-perpendicular.

Figure 3:
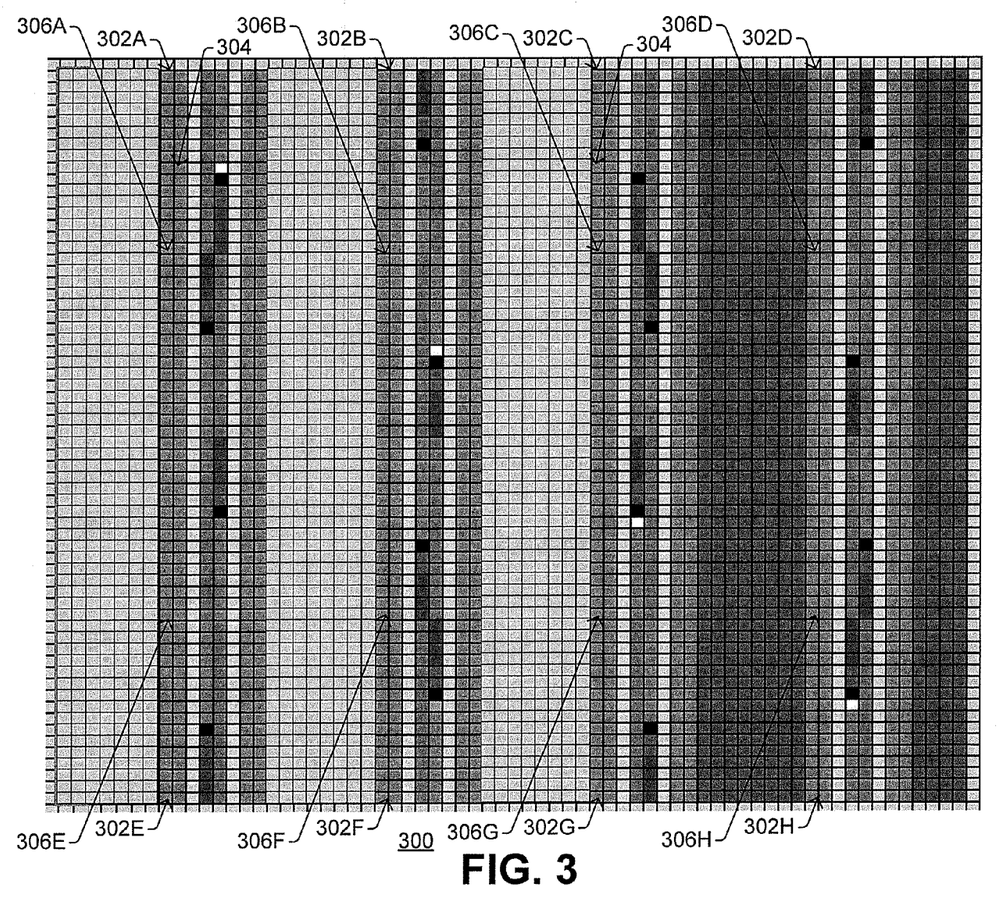
FIG. 3 illustrates an exemplary embodiment of a capacitor array having eight substantially identical sub-arrays.

Further, the number of unit capacitors and the number of sub-arrays within a capacitor array is not limited to the illustrated implementations. Rather any number of bits and any number of sub-arrays could be used. FIG. 3, for example, shows an exemplary embodiment of capacitor array 300 wherein the unit capacitors are grouped into 12 capacitor elements arranged eight substantially identical sub-arrays 302A-302H. In this embodiment, some of the sub-arrays are rotated or flipped horizontally or vertically with respect to one another, but are otherwise substantially identical. For example, if one sub-array (302A or 302C) is flipped horizontally with respect to the other sub-array (302C or 302A, respectively), the sub-arrays (302A, 302C) differ in the location of only a single unit capacitor (304). Even without being horizontally flipped, the locations of ⅞ (i.e., 87.5%) of the unit capacitors are still in the same locations for these sub-arrays 302A, 302C. Similar to FIG. 1's embodiment, the respective sub-arrays 302A-302H are symmetric in many regards about their respective origins 306A-306H.

Figure 4A:
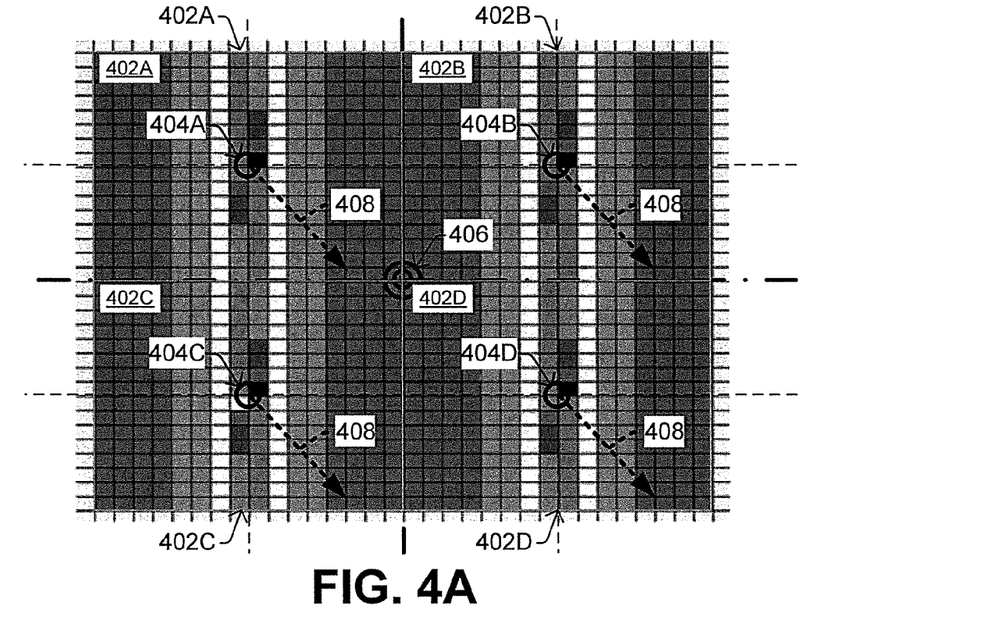
FIGS. 4A-4B illustrate an example of how sub-arrays can be shifted relative to a central origin of the capacitor array.
Figure 4B:
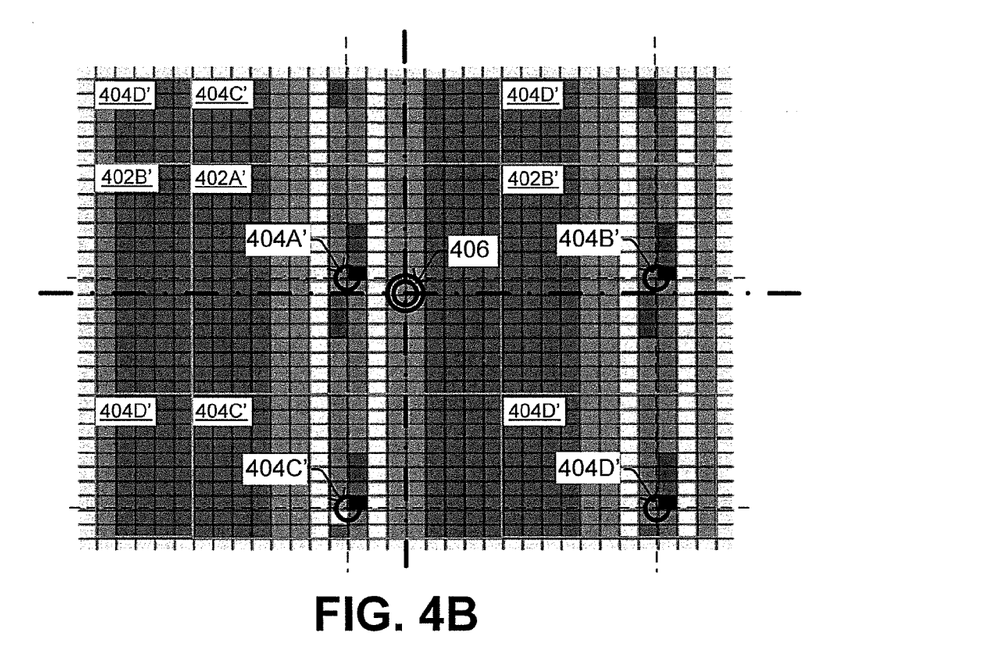

Although FIGS. 1-3 have shown examples where the origins of the sub-arrays have been arranged symmetrically about the center of the array, this symmetry is not present in all embodiments. As shown in FIG. 4A-4B, in some embodiments, sub-arrays can have respective origins that are shifted relative to the center of the array. Thus, FIG. 4A shows a case where the sub-array origins 404A-404D are arranged symmetrically about the array center 406. In FIG. 4B, however, the coordinate system for the sub-arrays has been shifted or offset, relative to the array center 406 of FIG. 4A (e.g., as indicated by arrows 408 in FIG. 4A). The result of this shifting is that the shifted sub-arrays 402A'-402D' in FIG. 4B, although still substantially identical, can now be "split" over the edges of the array. For example, although shifted sub-array 402A' is still a single contiguous block of unit capacitors, shifted sub-array 402B' is now split laterally about opposite sides of shifted sub-array 402A'. Shifted sub-array 402C' is now split vertically about opposite sides of sub-array 402A. Sub-array 402D' is split horizontally and vertically into four non-contiguous blocks, although it is in other regards still substantially identical to the other sub-arrays.

In some embodiments, these and other capacitor arrays can be included in an n-bit successive approximation analog to digital converter (SAR-ADC), which uses a binary weighted capacitor array. In such an SAR-ADC, the smallest capacitor element has a single unit capacitance, the next capacitor element has two units of capacitance, the next capacitor element has four units of capacitance, and so on, up to up to $2^{n-1}$. As an example, a 10-bit SAR-ADC can use 10 capacitor elements formed from an array of 1024 unit capacitors, wherein a first (largest) capacitor element is made of 512 unit capacitors, the second capacitor element is made of 256 unit capacitors, the third capacitor element is made of 128 unit capacitors, the fourth capacitor element is made of 64 unit capacitors, and so on, until the tenth (smallest) capacitor element is made up of only a single unit capacitor.

Figure 5:
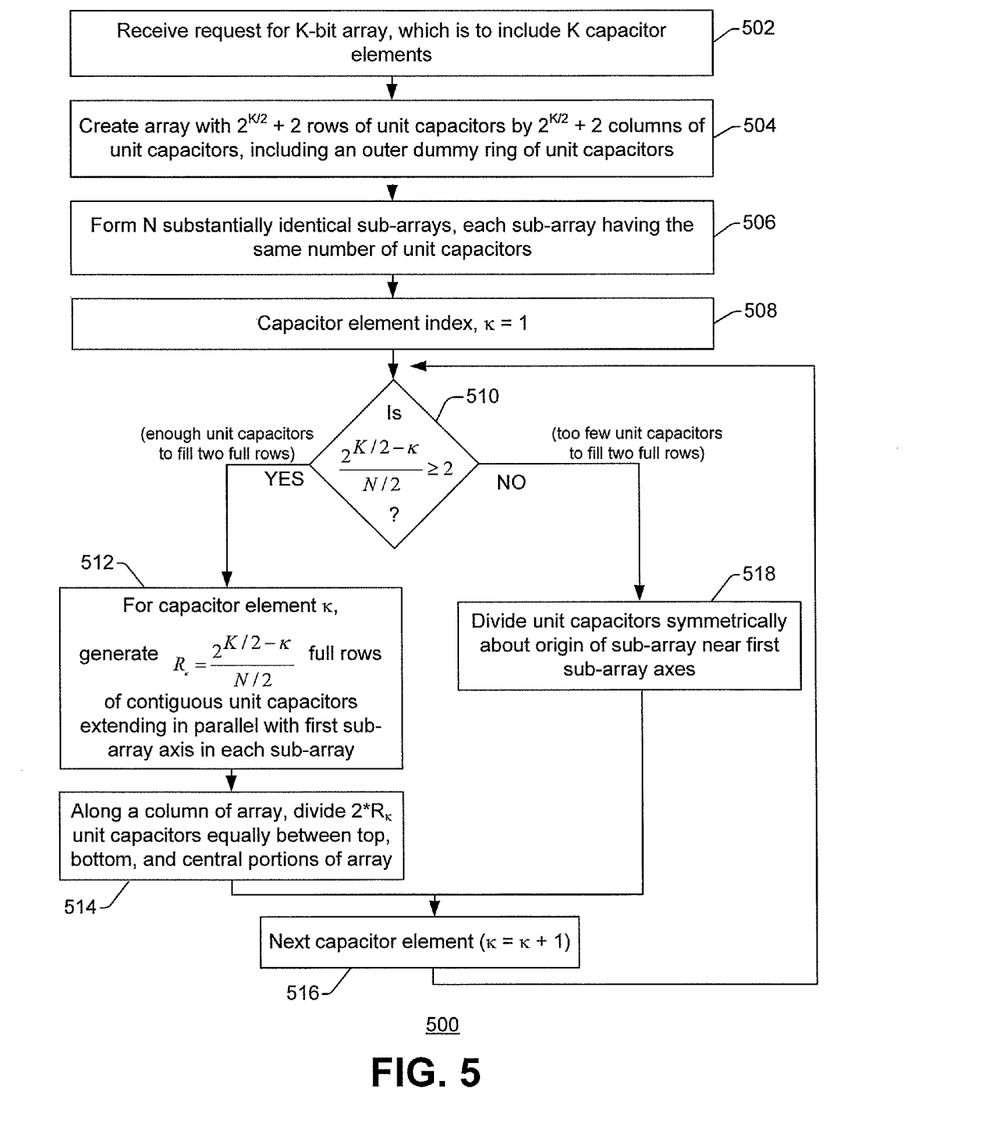
FIG. 5 illustrates an exemplary method of forming a capacitor array.

FIG. 5 shows an exemplary method 500 for generating a capacitor array in accordance with some embodiments. Although the steps of this method are illustrated as blocks or acts, it will be appreciated that the disclosure is not limited to the illustrated embodiment. For example, the steps can be broken into additional steps or can be combined into fewer steps, and the order of such steps can be different from those illustrated. Further, although this method refers to FIG. 1's embodiment for purposes of clarity, the methodology is in no way limited to FIG. 1's implementation. The methodology 500 is often carried out on a computer employing automated design tools which are typically implemented in software. Examples of automated design tools include layout tools, auto-place and route tools, schematic tools, hardware description languages (e.g., verilog or VHDL), and the like.

FIG. 5's method starts at 502 when a request for a K-bit array is received, wherein the K-bit array is to include K capacitor elements. For example, in FIG. 1's previously discussed capacitor array 100 included 10 capacitor elements (labeled B9-B0), such that K=10.

In 504, the method creates an array made up of columns and rows of unit capacitors. Assuming K=10 for purposes of explanation, the array will include 34 rows (i.e., $2^{(10/2)}+2$) and 34 columns (i.e., $2^{(10/2)}+2$), wherein 2 peripheral rows and 2 peripheral columns are made up of dummy unit capacitors, such as previously shown in FIG. 1.

In 506, the method forms N substantially identical sub-arrays within the array. Each sub-array typically includes the same number of unit capacitors and often has the same angular orientation. For example, in FIG. 1's previously described embodiment, N=4.

In 508, the method sets a capacitor element index, κ, equal to 1 or some other initial value. In 510, the method evaluates the present capacitor element to determine if the number of unit capacitors for the capacitor element is sufficient to fill two full rows of the sub-array. If so (YES at 510), the method proceeds to 512, wherein $R_κ$ full rows of contiguous unit capacitors are formed. For example, for a first capacitor element 102 in FIG. 1 (κ=1), the corresponding unit capacitors (labeled B9) fill $R_κ=(2^{(10/2-1)}/(4/2))=8$ rows for each sub-array.

In 514, along a column of the array, $2*R_κ$ unit capacitors are divided equally between top, bottom and central portions of the array. In FIG. 1's embodiment, 16 unit capacitors along the first column are divided equally between upper region (uppermost 4 unit capacitors of column), lower region (lower most 4 unit capacitors of column), and central region (middle 8 unit capacitors of column).

After the unit capacitors are arranged in this manner, the capacitor element index is incremented in 516, and next capacitor element is evaluated again in 510.

If there are too few capacitors to fill two full rows (NO at 510), the method proceeds to 518 and divides the unit capacitors for the capacitor element symmetrically about the origins of the sub-arrays near first sub-array axes. For example, in FIG. 1, unit capacitors labeled (B6-B0) have too few unit capacitors to fill two full rows, so the unit capacitors are arranged symmetrically about sub-array axis 142.

Thus it will be appreciated that some embodiments relate a capacitor array arranged on a semiconductor substrate. The capacitor array includes an array of unit capacitors arranged in a series of rows and columns. An interconnect structure couples unit capacitors of the array to establish a plurality of capacitor elements. The respective capacitor elements have different numbers of unit capacitors and different corresponding capacitances. In establishing the plurality of capacitor elements, the interconnect structure couples unit capacitors of the array in substantially identical sub-arrays tiled over the semiconductor substrate.

Other embodiments relate to a method of forming a capacitor array. The method arranges a plurality of unit capacitors in a series of rows and columns, and couples the unit capacitors to establish a plurality of capacitor elements. The respective capacitor elements have different numbers of unit capacitors and different corresponding capacitances. The unit capacitors of the array are coupled to so as to establish a plurality of substantially identical sub-arrays tiled over the semiconductor substrate.

Still another embodiment relates to a method of forming a capacitor array. This method receives a request for a K-bit capacitor array which is to include K capacitor elements. The method creates a capacitor array comprising $2^{(K/2)}+2$ rows of unit capacitors and $2^{(K/2)}+2$ columns of unit capacitors, including an outer dummy ring of unit capacitors. The unit capacitors are coupled into N substantially identical sub-arrays within the array, wherein respective sub-arrays have approximately equal numbers of unit capacitors. A κth capacitor element has $2^{(K/2-κ)}$ full rows of contiguous unit capacitors extending in parallel with a first sub-array axis in respective sub-arrays.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A capacitor array arranged on a semiconductor substrate and comprising:
   an array of unit capacitors arranged in a series of rows and columns;
   an interconnect structure to couple unit capacitors of the array to establish a plurality of capacitor elements, wherein the respective capacitor elements have different numbers of unit capacitors and different corresponding capacitances;
   wherein, in establishing the plurality of capacitor elements, the interconnect structure couples unit capacitors of the array in substantially identical sub-arrays, which are tiled together in rows and columns over the semiconductor substrate, wherein neighboring sub-arrays along a row are substantially identical as defined by locations of unit capacitors forming respective capacitor elements and wherein neighboring sub-arrays along a column are substantially identical as defined by locations of unit capacitors forming respective capacitor elements.

2. The capacitor array of claim 1, wherein the substantially identical sub-arrays are equal in size when tiled over the semiconductor substrate.

3. The capacitor array of claim 2, wherein the substantially identical sub-arrays have the same angular orientation when tiled over the semiconductor substrate.

4. The capacitor array of claim 1, wherein the sub-arrays are made up of respective unit capacitors in respective sub-array locations, and wherein at least approximately 87% of the unit capacitors and less than 100% of the unit capacitors are in the same sub-array locations for a first sub-array and a second sub-array.

5. The capacitor array of claim 1, wherein the sub-arrays are made up of respective unit capacitors in respective sub-array locations, and wherein at least approximately 95% of the unit capacitors and less than 100% of the unit capacitors are in the same sub-array locations a first sub-array and a second sub-array.

6. The capacitor array of claim 1, wherein capacitance values of the respective capacitor elements of the array follow a geometric progression with a common ratio of approximately two.

7. The capacitor array of claim 1, wherein a first capacitor element is made up of a first plurality of unit capacitors extending continuously across an entire first row of the array and continuously across an entire second row of the array.

8. The capacitor array of claim 7, where the first and second rows extend in parallel with a first sub-array axis extending through an origin of the first sub-array.

9. The capacitor array of claim 8, wherein the first and second rows are symmetrically spaced about opposite sides of the first sub-array axis.

10. A capacitor array arranged on a semiconductor substrate and comprising:
an array of unit capacitors arranged in a series of rows and columns;
an interconnect structure to couple unit capacitors of the array to establish a plurality of capacitor elements, wherein the respective capacitor elements have different numbers of unit capacitors and different corresponding capacitances;
wherein, in establishing the plurality of capacitor elements, the interconnect structure couples unit capacitors of the array in substantially identical sub-arrays tiled over the semiconductor substrate;
wherein a first capacitor element is made up of a first plurality of unit capacitors extending continuously across an entire first row of the array and continuously across an entire second row of the array;
where the first and second rows extend in parallel with a first sub-array axis extending through an origin of the first sub-array;
wherein the first and second rows are symmetrically spaced about opposite sides of the first sub-array axis;
wherein a second capacitor element includes a second plurality of unit capacitors extending continuously across an entire third row and continuously across an entire fourth row of the array.

11. The capacitor array of claim 10, where the third and fourth rows extend in parallel with the first sub-array axis and wherein the third and fourth rows are symmetrically spaced about opposite sides of the first sub-array axis.

12. The capacitor array of claim 11, wherein the third and fourth rows are closer to the first sub-array axis, relative to the first and second rows which are farther from the first sub-array axis.

13. A capacitor array arranged on a semiconductor substrate and comprising:
an array of unit capacitors arranged in a series of rows and columns;
an interconnect structure to couple unit capacitors of the array to establish a plurality of capacitor elements, wherein the respective capacitor elements have different numbers of unit capacitors and different corresponding capacitances;
wherein, in establishing the plurality of capacitor elements, the interconnect structure couples unit capacitors of the array in substantially identical sub-arrays tiled over the semiconductor substrate;
wherein a first capacitor element comprises: a first plurality of unit capacitors arranged on opposing distal regions of a column of the array and in a central region of the column; and
wherein a second capacitor element includes a second plurality of unit capacitors arranged between a first of the opposing distal regions and the central region and between a second of the opposing distal regions and the central region.

14. A method of forming a capacitor array, comprising:
arranging a plurality of unit capacitors in a series of rows and columns; and
coupling the unit capacitors to establish a plurality of capacitor elements, wherein the respective capacitor elements have different numbers of unit capacitors and different corresponding capacitances;
wherein the unit capacitors of the array are coupled to so as to establish a plurality of substantially identical sub-arrays, which are tiled together in rows and columns over the semiconductor substrate, wherein neighboring sub-arrays along a row are substantially identical as defined by locations of unit capacitors forming respective capacitor elements and wherein neighboring sub-arrays along a column of are substantially identical as defined by locations of unit capacitors forming respective capacitor elements.

15. The method of claim 14, wherein the sub-arrays are made up of respective unit capacitors in respective sub-array locations, and wherein at least approximately 87% of the unit capacitors and less than 100% of the unit capacitors are in the same sub-array locations for a first sub-array and a second sub-array.

16. The method of claim 14, wherein the sub-arrays are made up of respective unit capacitors in respective sub-array locations, and wherein at least approximately 95% of the unit capacitors and less than 100% of the unit capacitors are in the same sub-array locations a first sub-array and a second sub-array.

17. A method of forming a capacitor array, comprising:
receiving a request for a K-bit capacitor array which is to include K capacitor elements;
creating a capacitor array comprising $2^{(K/2)}+2$ rows of unit capacitors and $2^{(K/2)}+2$ columns of unit capacitors, including an outer dummy ring of unit capacitors; and
coupling the unit capacitors into N substantially identical sub-arrays within the array, wherein respective sub-arrays have approximately equal numbers of unit capacitors;
wherein a $\kappa$th capacitor element has $(2^{(K/2-\kappa)})/(N/2)$ full rows of contiguous unit capacitors extending in parallel with a first sub-array axis in respective sub-arrays.

18. The method of claim 17, wherein the unit capacitors of the $\kappa$th capacitor element are non-contiguous along a column of the array.

19. The method of claim 18, wherein the unit capacitors along the column of the array for the $\kappa$th capacitor element are divided between a top region of the column, a bottom region of the column and a central portion of the column along the column of the array.

* * * * *